(12) United States Patent
Emmerik et al.

(10) Patent No.: US 6,404,015 B2
(45) Date of Patent: Jun. 11, 2002

(54) SEMICONDUCTOR DEVICE

(75) Inventors: Arnoldus Johannes Maria Emmerik; Rene Paul Zingg; Johannes Van Zwol, all of Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/739,509

(22) Filed: Dec. 18, 2000

(30) Foreign Application Priority Data

Dec. 20, 1999 (EP) .............................. 99204404

(51) Int. Cl.$^7$ .......................... H01L 27/01; H01L 27/12; H01L 31/0392
(52) U.S. Cl. ........................ 257/348; 257/350; 257/401; 257/403; 257/488
(58) Field of Search ................................ 257/348, 350, 257/401, 403, 488

(56) References Cited

U.S. PATENT DOCUMENTS

| | | | |
|---|---|---|---|
| 4,611,220 A | 9/1986 | Maciver | 357/23 |
| 5,300,448 A | 4/1994 | Merchant et al. | 437/41 |
| 5,559,346 A | 9/1996 | Kushida | 257/138 |
| 5,973,341 A | 10/1999 | Letavic et al. | 257/287 |
| 6,150,697 A * | 11/2000 | Teshighara et al. | 257/347 |
| 6,191,453 B1 * | 2/2001 | Petruzzello et al. | 257/350 |

* cited by examiner

*Primary Examiner*—Ngân V. Ngô
(74) *Attorney, Agent, or Firm*—Aaron Waxler

(57) ABSTRACT

The invention relates to a SOI deep depletion MOS transistor provided in a thin silicon layer (5) adjoining a surface (4) of a silicon body (3) and insulated from a silicon substrate (7) by a buried oxide layer (6). The channel region (13) of a first conductivity type is provided with at least one and preferably a plurality of zones (16) of the opposite conductivity type adjoining the surface to remove minority carriers from the interface between the channel and the gate oxide (15). The zones (16) extend across the whole thickness of the channel and adjoin the buried oxide at the side of the channel remote from the gate dielectric. Due to this construction, minority carriers are removed also from the rear side of the channel. This enables the transistor to be operative also at high voltages having values at which the substrate and the buried oxide operate as a second gate and as a second gate dielectric, respectively. The transistor may be used to advantage in high-voltage ICs comprising a low-voltage circuit part operated with a low supply voltage generated by the transistor.

12 Claims, 4 Drawing Sheets

SEMICONDUCTOR DEVICE

BACKGROUND OF THE INVENTION

The invention relates to a semiconductor device with a MOS transistor of the depletion type comprising a semiconductor body with a semiconductor layer of a first conductivity type adjoining a surface of said body, a semiconductor substrate situated at the side of the semiconductor layer facing away from the surface, and a layer of electrically insulating material, referred to as insulating layer hereinafter, disposed between the semiconductor layer and the semiconductor substrate, which semiconductor layer is provided with a source and a drain in the form of surface zones of the first conductivity type which are mutually separated by an interposed channel region of the first conductivity type, while the surface is covered with a gate dielectric on which a gate electrode is provided. Such a device is known, inter alia, from the patent document U.S. Pat. No. 4,611,220.

Transistors of the kind described above, in which the conduction between the source and the drain is controlled by means of a depletion region in the channel induced by the insulated gate, are often denoted deep depletion MOS transistor in the literature. If the transistor is of the n-channel type, a voltage of 0 V or lower with respect to the source is usually applied to the gate. Given a sufficiently high drain voltage, the depletion region at the drain side of the channel will expand to the extent that the channel is pinched, so that the current between source and drain rises no further upon a further increase in the drain voltage. This (current-independent) voltage will be referred to as the pinch voltage below.

Such transistors may advantageously be used as voltage reducers in the supplies of, for example, integrated circuits. High-voltage circuits (or high current circuits) are often used in a common silicon crystal in so-called Smart Power IC processes, in combination with control circuits which are operated at low voltages or considerably lower voltages than the high-voltage components. These low-voltage circuits often require a much lower supply voltage than the externally supplied voltage for the integrated circuit, for example the rectified mains voltage. The pinch voltage of the deep depletion MOS transistor connected as a source follower can be used for obtaining this lower supply voltage.

The patent document U.S. Pat. No. 4,611,220 cited above describes a deep depletion MOS transistor in SOI (Silicon On Insulator) technology. The carrier body used in the known device is a silicon substrate which is covered with a sapphire layer. The semiconductor layer in which the transistor is formed is an n-type silicon layer which is provided epitaxially on the sapphire layer and is provided with strongly doped n-type surface zones which form the source and the drain. The gate dielectric is formed by a silicon oxide layer on which the gate electrode is provided. To prevent inversion occurring at the boundary between the channel region and the gate oxide during operation as a result of the generation of minority charge carriers,—holes in the case of an n-channel transistor—, p-type surface zones are locally provided in the channel region, which zones extend from the surface over part of the thickness of the epitaxial layer into the epitaxial layer. As is described in the patent document, an inversion layer would be formed below the gate without these p-type zones, hampering a satisfactory operation of the transistor because the thickness of the depletion layer cannot or substantially cannot be controlled any more by means of the gate voltage after the inversion layer has been formed. The inversion layer below the gate can be prevented through the removal of the holes via said p-type zones.

The research on which the present invention is based has shown that the transistor cannot or substantially cannot be brought into a stable pinch state at higher voltages, for example a few hundreds of volts, also with the use of a removal mechanism for minority charge carriers as described above.

SUMMARY OF THE INVENTION

The invention has for its object inter alia to provide a deep depletion SOI MOS transistor which can be operated also at higher voltages such that pinching takes place, and which can accordingly be used, for example, for generating a lower supply voltage in integrated high-voltage circuits with a high external supply voltage.

According to the invention, a semiconductor device of the kind described in the opening paragraph is for this purpose characterized in that the semiconductor layer is provided with at least one zone of the opposed, second conductivity type for the purpose of removing minority charge carriers from the channel region, which zone is provided with an electrical connection, forms a pn junction with the channel region, and extends transversely across the thickness of the semiconductor layer between the surface and the insulating layer.

The invention is based on the recognition inter alia that at higher voltages the (conductive) semiconductor substrate, which is separated from the channel by a comparatively thick insulating layer, also acts as a gate, so that also at the other side of the semiconductor layer opposite the surface an inversion layer can be formed which counteracts a total pinching of the channel. Since said zones of the second conductivity type in a device according to the invention extend across the entire thickness of the semiconductor layer, minority charge carriers can also be removed at the boundary between the semiconductor layer and the insulating layer at the substrate side, so that the channel can be pinched also at higher voltages.

A major embodiment of a device according to the invention is characterized in that the semiconductor layer is provided, next to said zone of the second conductivity type which is referred to as first zone hereinafter, with a second zone of the second conductivity type which is situated next to the first zone, which also extends across the entire thickness of the semiconductor layer, which forms a pn junction with the channel region, and which is separated from the first zone of the second conductivity type by an interposed portion of the channel region, the interspacing between said zones in relation to the thickness of the semiconductor layer being so great at the area of the channel region that pinching of the channel in lateral direction is prevented. The width of the channel can be optimally designed in that the channel is provided with two or more zones for the removal of minority charge carriers, for example with a view to the desired current-conducting power in a certain application of the transistor. The provision of the zones at a sufficiently great distance from one another can prevent then that the channel is pinched in lateral direction through depletion of the channel from the pn junctions between the channel and the zones of the opposed conductivity type, which would make the pinch voltage undesirably low. A further embodiment thereof, which has the advantage of an efficient removal of minority charge carriers over the entire channel width between the zones, is characterized in that the interspacing between the two zones is so small that the application of a reverse bias voltage across the pn junctions between the zones of the second conductivity type and the channel region of the first conductivity type is capable of inducing an electric field with a component directed to one of the zones of the second conductivity type, which field extends over the full interspacing between said zones.

A further embodiment of a semiconductor device according to the invention is characterized in that a drift region is situated in the semiconductor layer between the channel region and the drain. The drift region raises the breakdown voltage of the transistor, which renders the circuit suitable for operation at very high voltage values. The electric field in the drift region will drive majority charge carriers to the drain, and minority charge carriers generated in the drift region will be driven to the channel region, where they will be removed through said zones of the opposed conductivity type. An embodiment in which a favorable field distribution is obtained in the drift region is characterized in that the thickness of the semiconductor layer is smaller at the area of the drift region than at the area of the channel region. A further embodiment is characterized in that, a silicon layer being used as the semiconductor layer, the semiconductor layer is provided with a silicon oxide layer at the area of the drift region, which silicon oxide layer lies recessed in the semiconductor layer over at least a portion of its thickness. A further improvement of the field distribution in the drift region is obtained in an embodiment which is characterized in that the doping concentration in the drift region increases in a direction from the source to the drain. Reference is made to the patent U.S. Pat. No. 5,300,448 in this connection, in which a SOI high-voltage transistor with such a drift region is described.

Preferably, a field plate is provided above the drift region, which renders possible, as is known, a better combination of a high breakdown voltage (for example with the resurf effect) and a low on-resistance. A further embodiment, in which a more or less symmetrical field distribution is obtained, is characterized in that the distance between the field plate and the drift region is equal or at least substantially equal to the distance between the drift region and the semiconductor substrate.

The zone (or zones) of the second conductivity type is (are each) provided with a separate contact for the removal of minority charge carriers. A major embodiment of a semiconductor device according to the invention is characterized in that the zone or zones of the second conductivity type is or are conductively connected to the gate electrode. The field plate may also be conductively connected to the gate electrode in this case. In alternative embodiments, different voltages are applied to the gate and to the field plate, in which case it may be advantageous to apply the same voltage to the zones removing the minority charge carriers and to the field plate. A further embodiment is accordingly characterized in that the zone or zones of the second conductivity type is or are conductively connected to the field plate.

These and other aspects of the invention will be explained in more detail below with reference to an embodiment. In the drawing:

Figure 2:
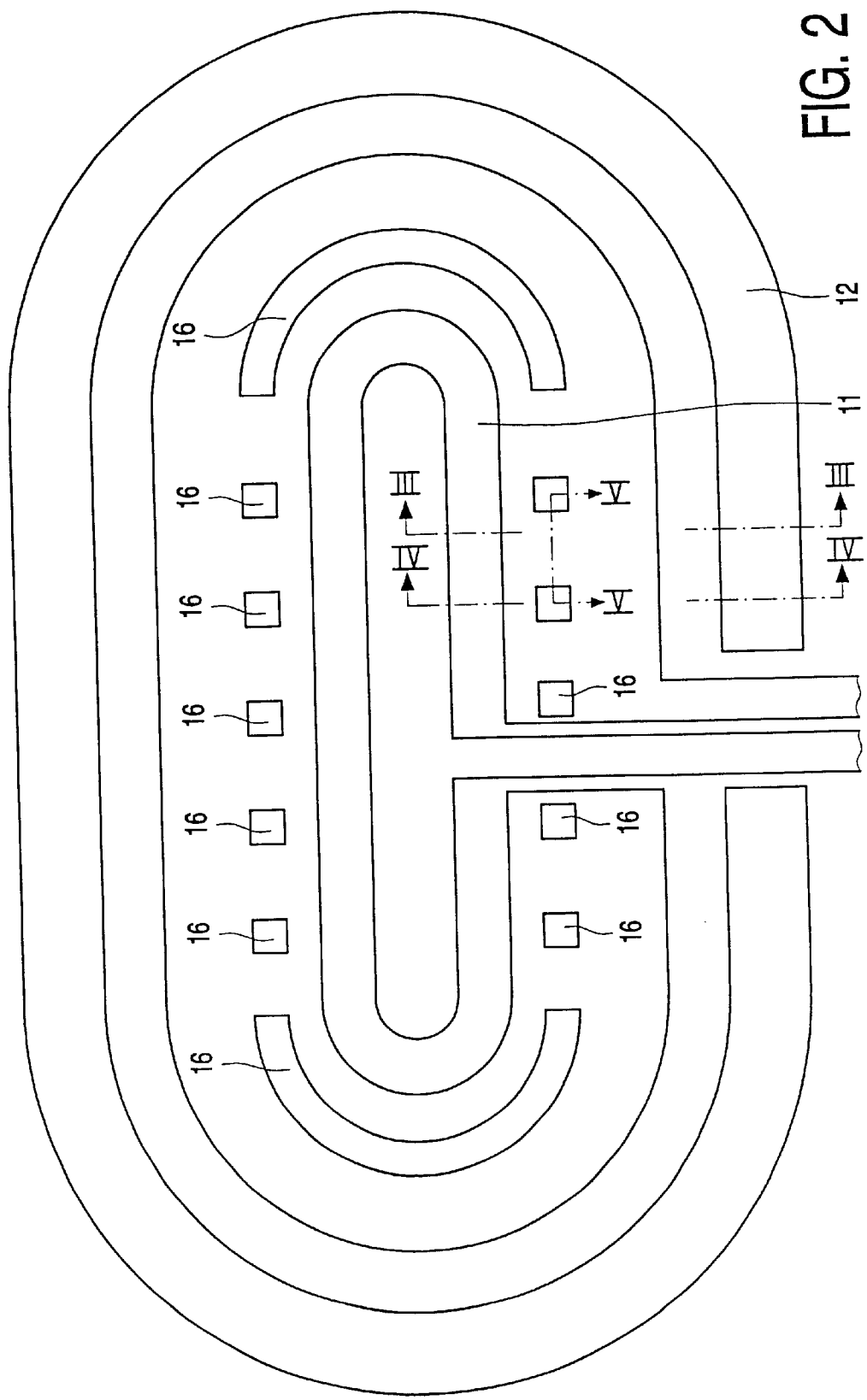
FIG. 2 is a diagrammatic plan view of a semiconductor device according to the invention.
Figure 3:
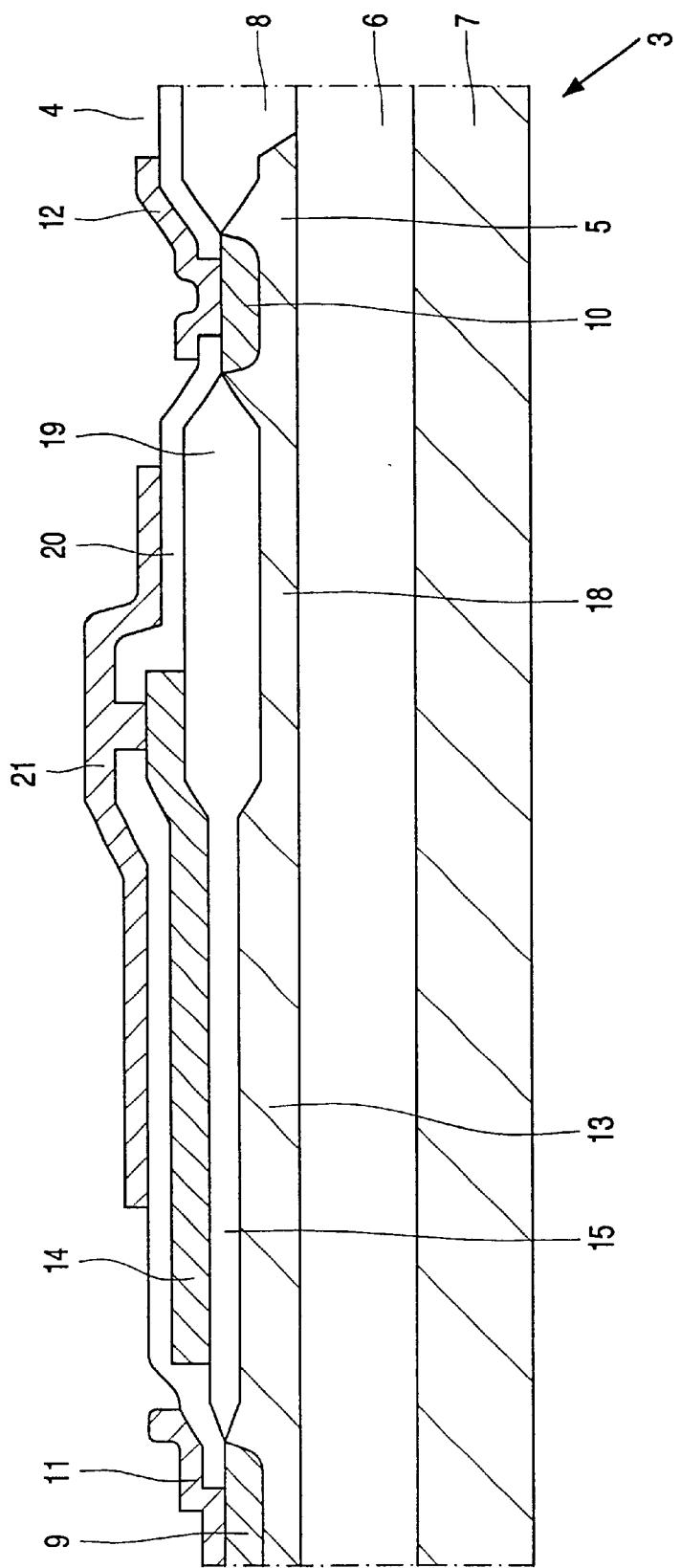
FIG. 3 is a cross-sectional view of this device taken on the line III—III in FIG. 2.
Figure 4:
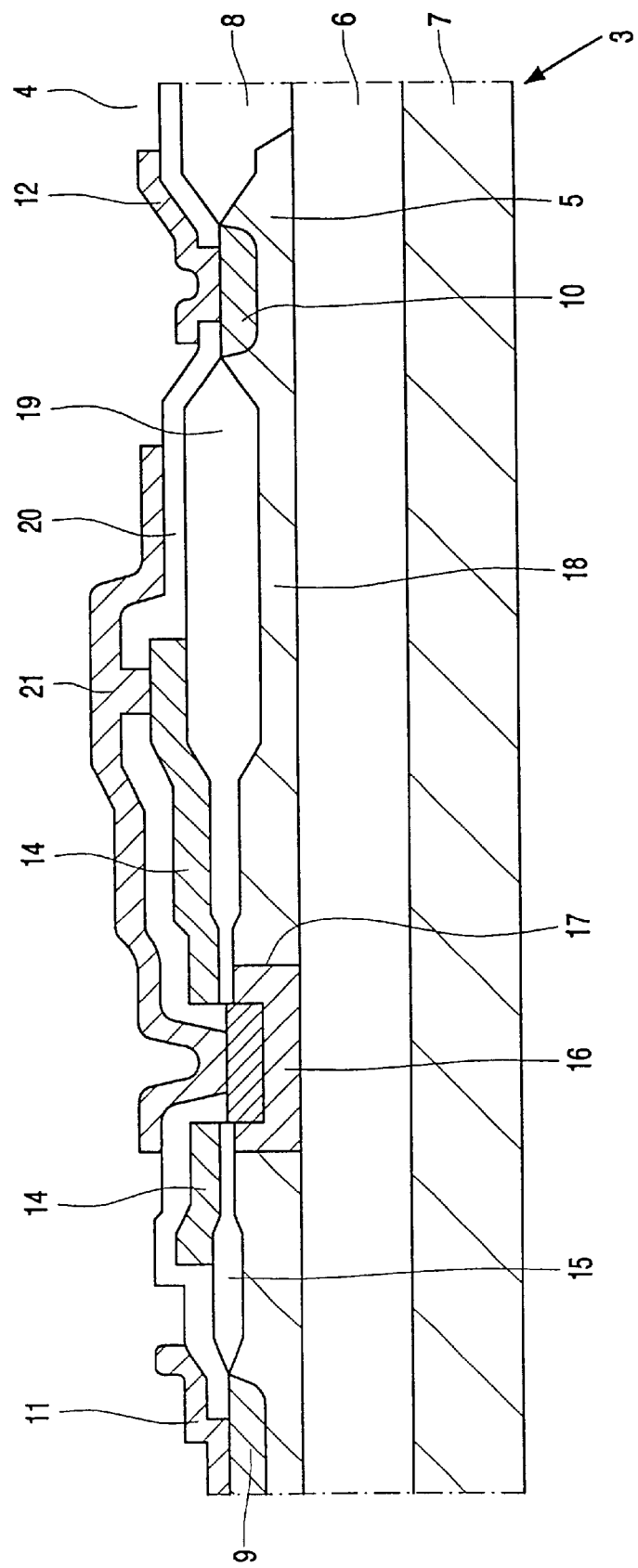
FIG. 4 is a cross-sectional view of this device taken on the line IV—IV in FIG. 2.

It is noted that the drawing is diagrammatic and not true to scale. The plan view of FIG. 2 only shows the metal source and drain contacts, the field plate, and the zones for the removal of the minority charge carriers. Other regions, such as the source and drain zones and the polycrystalline gate, have been left out to keep the drawing clear. It is further noted that, although the invention is explained with reference to an n-channel transistor below, it may be equally advantageously applied to p-channel transistors.

DESCRIPTION OF THE PREFERRED EMBODIMENTS

Figure 1:
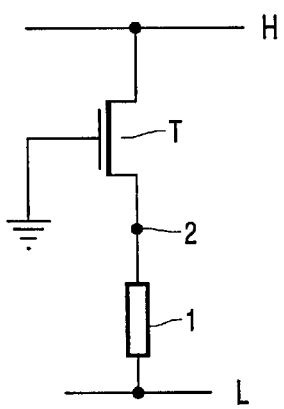
FIG. 1 is an equivalent diagram of a circuit comprising a transistor according to the invention.
Figure 5:
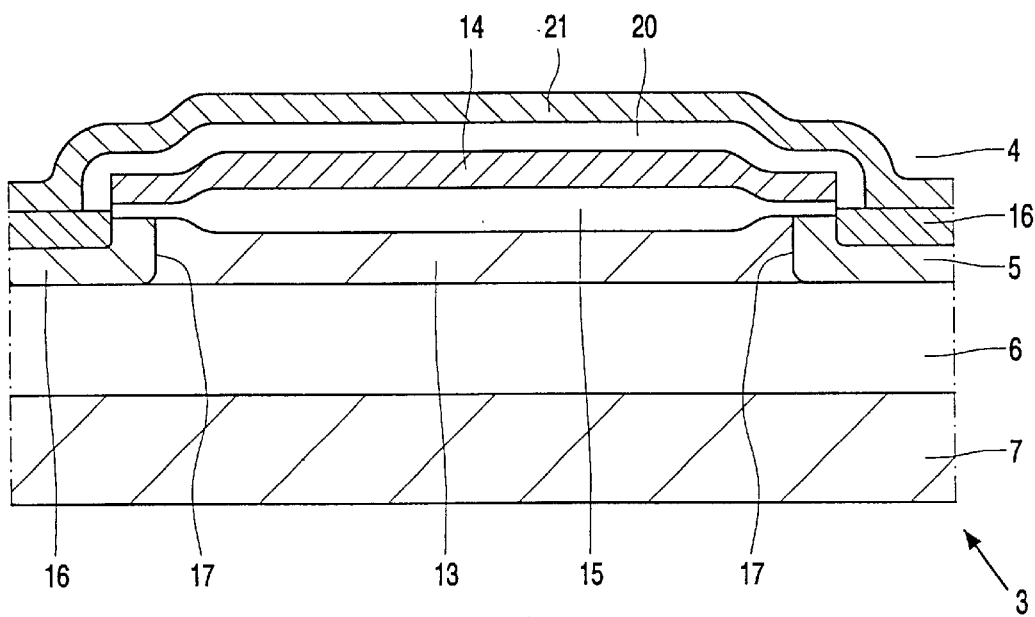
FIG. 5 is a cross-sectional view of this device taken on the line V—V in FIG. 2.

A transistor according to the invention may be advantageously used in integrated high-voltage circuits in which part of the circuit is operated at a comparatively low supply voltage. In FIG. 1, H represents the high supply voltage, for example 600 V, and L the low voltage, for example ground. The low-voltage circuit is represented by the load 1 and requires a supply of, for example, 25 V. This voltage is delivered by the depletion field effect transistor T whose drain is connected to the high voltage H and whose source is connected to a junction point 2 which is connected to ground via the load 1 (source follower mode). The gate of the transistor is connected to a low reference voltage, for example ground. The transistor adjusts itself such that the voltage at the junction point 2 is equal to or at least practically equal to the pinch voltage. Given a correct dimensioning of the transistor, a suitable value can be obtained for the pinch voltage, i.e. 25 V in the present example.

The device shown in FIG. 1 may in its entirety or partly form part of an integrated circuit of which FIGS. 2 to 5 only show that portion which contains the transistor T. The circuit comprises a semiconductor body 3, in this example made of silicon, with a semiconductor layer 5 of a first conductivity type, of n-type silicon in this example of an n-channel transistor, adjoining the surface 4. The thickness and the doping concentration of the layer 5 are, for example, 1 to 1.5 $\mu$m and $10^{16}$ to $5\times10^{16}$ atoms per cm$^3$. The silicon layer 5 is bounded at the side opposed to the surface 4 by a layer 6 of electrically insulating material which insulates the silicon layer 5 from the subjacent silicon substrate 7. The substrate 7 is preferably n-type doped. The layers 5 and 6 form a SOI (Silicon On Insulator) structure which may be manufactured in various ways which are known per se. Thus the layer 6 may be formed, for example, by a layer of aluminum oxide (sapphire) on which the silicon layer 5 is epitaxially grown. Other techniques which may advantageously be used are "smart cut" and "wafer bonding" techniques, whereby two crystals, of which at least one is provided with an oxide layer, are fastened to one another, whereupon the silicon layer 5 can be manufactured from one of the crystals through etching or polishing. In the present example, the insulating layer 6 is formed by a buried layer of silicon oxide which is obtained in a known manner by a smart cut technique. The thickness of the layer 6 is approximately 3 $\mu$m.

Islands which are mutually electrically insulated, for example by means of regions 8 of silicon oxide extending transversely across the thickness of the silicon layer 5, are formed in the layer 5. The transistor comprises a source in the form of a strongly doped n-type surface zone 9 and a drain in the form of a strongly doped surface zone 10. The source and the drain are connected to a metal contact 11 and a metal contact 12, respectively. As is evident from FIG. 2, the drain lies around the source in this embodiment, but it will be obvious that alternative configurations are equally possible. A channel region 13 formed by a portion of the island-shaped n-type silicon layer 5 is situated between the source 9 and the drain 10. A gate 14 in the form of an n-type doped polycrystalline silicon layer, referred to as poly for short hereinafter, is provided above the channel region. The channel and the gate are separated from one another by a layer 15 of silicon oxide which forms the gate dielectric of the transistor. The thickness of the oxide layer 15 is approximately 0.8 μm in the present example of a high-voltage transistor. Some other suitable material may be chosen instead of silicon oxide for the gate dielectric.

The transistor forms a depletion MOS transistor in which a depletion region is induced in the channel by a negative voltage (with respect to the source) at the gate 14, which controls the conduction between source and drain. When the depletion region pinches the channel at a sufficiently high voltage at the drain, the transistor is in the pinch state, which is used in the application shown in FIG. 1. To prevent inversion occurring at the boundary between the channel 13 and the gate oxide 15 and at the boundary between the channel 13 and the buried oxide layer 6 in this state, the n-type silicon layer 5 is provided with at least one p-type zone 16 which forms a pn junction 17 with the channel and which extends transversely across the thickness of the channel 13. To obtain an efficient charge removal for any width of the channel, adapted to the specific application, a number of zones 16 distributed over the channel width are provided in the semiconductor layer. As is visible in FIG. 2, most of these zones are rectangular in shape; the zones 16 at either end of the transistor have a curved shape and cover the entire bend in the channel. This, however, is not necessarily the case; it is alternatively possible for small zones 16 to be formed at the ends, mutually separated by portions of the channel. The shape of the zones 16 at either end as shown here has certain advantages for design technology which arise from the chosen oval shape of the transistor. In an embodiment in which the transistor is not oval but, for example, rectangular, it is obvious that mutually separated zones 16 may be used at the ends. To prevent the pinch voltage being determined by depletion caused by the zones 16 (as in a junction field effect transistor), the zones should be situated at sufficiently great distances from one another, as compared with the channel thickness. On the other hand, the zones 16 are preferably situated so closely together, for an efficient removal of minority charge carriers, that a small, laterally directed field is present across the entire width of the channel, such that holes drift towards the zones 16. In the present example with a channel thickness of 1 μm, a value of 15 μm was chosen for the interspacings between the zones 16, which was found to be a favorable value which satisfies both conditions set out above.

The transistor is provided with a drift region 18 between the channel 13 and the drain 10 with a length of, for example, 70 μm in view of the high voltages which may be applied to the drain. The semiconductor layer 3 is provided with a thinned portion at the area of the drift region, in this example formed in that the layer 5 is oxidized through a greater portion of its thickness than at the area of the channel 13. The oxide layer 19 above the drift region 18 has a thickness of approximately 2.0 μm and is accordingly substantially thicker than the silicon oxide layer 15 which forms the gate dielectric of the transistor and which has a thickness of approximately 0.8 μm. A further silicon oxide layer 20, for example in the form of a deposited TEOS layer, is provided on the gate electrode 14 and the oxide layer 19, on which layer 20 a metal field plate 21 is provided. The function of such a field plate, which provides a higher breakdown voltage in combination with a low on-resistance through an improvement in the field distribution, is known. The field plate is connected to the gate 14 and to the p-type zones 16 through contact windows in the oxide layer 20. The gate voltage is accordingly applied to the field plate 20 and the p-type zones 16. Obviously, the zones 16 and/or the field plate may also be connected to other junction points in the circuit, such that other voltages are applied to these regions. The source and drain contacts 11 and 12 are also provided in the oxide layer 20 via contact windows. The field plate 21 may be formed at the same time as the metal contacts 11 and 12.

Figure 6:
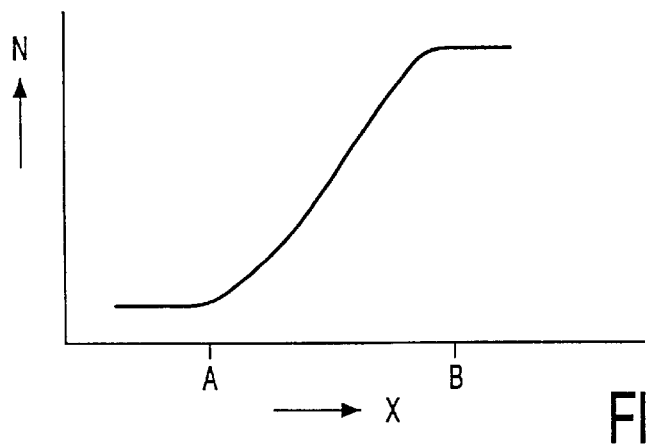
FIG. 6 is a graph plotting the doping profile in the drift region of the transistor of FIG. 2.

The thickness of the silicon oxide layer 20 is approximately 0.5 μm. The total thickness of the layers 19 and 20 is accordingly approximately 2.5 μm and is thus equal or at least substantially equal to the thickness of the buried oxide layer 6. Since equal or substantially equal voltages are applied to the gate electrode and the substrate 7 during operation, an electrically substantially symmetrical situation is obtained by means of the equal oxide thicknesses, which is favorable for the electric field distribution and thus for the breakdown voltage of the transistor. A further improvement may be obtained in that the drift region 18 is provided with a profiled doping whose concentration increases linearly in the direction from the source to the drain. This is shown in the graph of FIG. 6. In this Figure, the points A and B indicate the boundaries of the drift region at the channel side and at the drain side, respectively, of the drift region. The concentration (approximately $10^{16}$ per cm$^3$) is comparatively low at point A and corresponds to the background concentration of the layer 5 there. The concentration at point B is, for example, $10^{17}$ per cm$^3$. Reference is made to the patent document U.S. Pat. No. 5,300,448 for the manufacture and the function of the doping profile in the drift region of a SOI high-voltage transistor.

A high voltage of, for example, 500–800 V is applied to the drain during operation. The gate electrode 14 and the substrate 7 are jointly connected to ground or some other reference voltage. Given a pinch voltage of, for example, 25 V, the source of the transistor connected to the circuit with a supply voltage of approximately 25 V will adjust itself to a voltage somewhat lower than 25 V. The remainder of the voltage is across the depleted channel and drift region, which accordingly have a positive potential with respect to the gate 14 and the substrate 7. The p-type zones 16 prevent the formation of inversion layers at the boundaries between the channel 13 on the one hand and the oxide layers 15 and 6 on the other hand at the low voltage present at the gate 14 and the substrate 7. This renders it possible to adjust the pinch voltage of the transistor to a desired value through the design, within a limited region.

The device may be manufactured by means of techniques which are known per se to those skilled in the art and which will not be explained in any detail here.

It will be obvious that the invention is not limited to the embodiment described here but that many more variations are possible to those skilled in the art within the scope of the invention. Thus the zones 16 may alternatively be connected to the gate electrode or may be provided with a separate contact. It is also possible for the field plate 21 to be provided with a separate contact instead of being connected to the gate electrode. The p-type removal zones 16 may be placed so closely together that they are capable of lowering the pinch voltage without pinching the channel in lateral direction.

What is claimed is:

1. A semiconductor device with a MOS transistor of the depletion type comprising a semiconductor body with a semiconductor layer of a first conductivity type adjoining a surface of said body, a semiconductor substrate situated at the side of the semiconductor layer facing away from the surface, and a layer of electrically insulating material, referred to as insulating layer hereinafter, disposed between the semiconductor layer and the semiconductor substrate, which semiconductor layer is provided with a source and a drain in the form of surface zones of the first conductivity type which are mutually separated by an interposed channel region of the first conductivity type, while the surface is covered with a gate dielectric on which a gate electrode is provided, characterized in that the semiconductor layer is provided with at least one zone of the opposed, second conductivity type for the purpose of removing minority charge carriers from the channel region, which zone is provided with an electrical connection, forms a pn junction with the channel region, and extends transversely across the thickness of the semiconductor layer between the surface and the insulating layer.

2. A semiconductor device as claimed in claim 1, characterized in that the semiconductor layer is provided, next to said zone of the second conductivity type which is referred to as first zone hereinafter, with a second zone of the second conductivity type which is situated next to the first zone, which also extends across the entire thickness of the semiconductor layer, which forms a pn junction with the channel region, and which is separated from the first zone of the second conductivity type by an interposed portion of the channel region, the interspacing between said zones in relation to the thickness of the semiconductor layer being so great at the area of the channel region that pinching of the channel in lateral direction is prevented.

3. A semiconductor device as claimed in claim 2, characterized in that the interspacing between the two zones is so small that the application of a reverse bias voltage across the pn junctions between the zones of the second conductivity type and the channel region of the first conductivity type is capable of inducing an electric field with a component directed to one of the zones of the second conductivity type, which field extends over the full interspacing between said zones.

4. A semiconductor device as claimed in claim 1, characterized in that a drift region is situated in the semiconductor layer between the channel region and the drain.

5. A semiconductor device as claimed in claim 4, characterized in that the thickness of the semiconductor layer is smaller at the area of the drift region than at the area of the channel region.

6. A semiconductor device as claimed in claim 5, characterized in that, a silicon layer being used as the semiconductor layer, the semiconductor layer is provided with a silicon oxide layer at the area of the drift region, which silicon oxide layer lies recessed in the semiconductor layer over at least a portion of its thickness.

7. A semiconductor device as claimed in claim 6, characterized in that the gate dielectric also comprises a layer of silicon oxide which lies recessed in the semiconductor layer over at least part of its thickness and which has a thickness which is smaller than the thickness of the silicon oxide layer at the area of the drift region.

8. A semiconductor device as claimed in claim 4, characterized in that the doping concentration in the drift region increases in a direction from the source to the drain.

9. A semiconductor device as claimed in claim 4, characterized in that a conductive electrode forming a field plate for raising the breakdown voltage of the transistor is provided above the drift region.

10. A semiconductor device as claimed in claim 9, characterized in that the distance between the field plate and the drift region is equal or at least substantially equal to the distance between the drift region and the semiconductor substrate.

11. A semiconductor device as claimed in claim 1, characterized in that the zone or zones of the second conductivity type is or are conductively connected to the gate electrode.

12. A semiconductor device as claimed in claim 9, characterized in that the zone or zones of the second conductivity type is or are conductively connected to the field plate.

* * * * *